United States Patent [19]

York et al.

[11] 4,439,764
[45] Mar. 27, 1984

[54] DUAL MODE METER READING APPARATUS

[75] Inventors: Theodore H. York; Roger D. Moates, both of Raleigh, N.C.

[73] Assignee: Westinghouse Electric Corp., Pittsburgh, Pa.

[21] Appl. No.: 252,688

[22] Filed: Apr. 9, 1981

[51] Int. Cl.³ .................. G08C 19/00; G08C 19/16; G08C 19/20

[52] U.S. Cl. .................. 340/870.02; 340/870.06; 340/870.19; 340/347 P; 371/68; 377/28; 377/39

[58] Field of Search ......... 340/347 M, 870.02, 870.03, 340/870.06, 870.09, 870.19; 235/92 EC; 377/28, 39; 371/68

[56] References Cited

U.S. PATENT DOCUMENTS

| | | | |
|---|---|---|---|
| 3,253,260 | 5/1966 | Hawley . | |
| 3,310,801 | 3/1967 | Hood . | |
| 3,376,567 | 4/1968 | Brothman et al. | 340/310 A |
| 3,484,780 | 12/1969 | Kamoi et al. . | |
| 3,614,774 | 10/1971 | Clements | 340/347 P |
| 3,662,368 | 5/1972 | Farnsworth | 340/870.19 |
| 3,750,122 | 7/1973 | Maeda . | |
| 3,750,156 | 7/1973 | Martell | 340/347 P |
| 3,824,587 | 7/1974 | Fowler | 340/347 P |
| 3,846,788 | 11/1974 | Calabro et al. | 340/347 P |
| 3,846,789 | 11/1974 | Germer | 340/347 P |
| 3,878,391 | 4/1975 | McClelland et al. | 250/233 |
| 3,943,498 | 3/1976 | McClelland et al. | 346/14 MR |
| 3,990,062 | 11/1976 | Miller et al. | 340/870.19 |
| 3,992,705 | 11/1976 | Langenfeld . | |
| 4,037,219 | 7/1977 | Lewis | 250/231 SE |
| 4,066,960 | 1/1978 | Milkovic | 324/142 |
| 4,130,874 | 12/1978 | Pai | 340/310 A |
| 4,189,635 | 2/1980 | Sheller | 235/92 EC |
| 4,193,059 | 3/1980 | Harris | 340/870.09 |
| 4,255,809 | 3/1981 | Hillman | 371/68 |

FOREIGN PATENT DOCUMENTS 2746432 4/1979 Fed. Rep. of Germany .
1574318 9/1980 United Kingdom .

Primary Examiner—James J. Groody
Attorney, Agent, or Firm—William D. Lanyi

[57] ABSTRACT

A remote meter reading system includes a dial register encoder and a pulse encoder both coupled to the same rotary disc of our induction watthour meter. A first electronic data register stores the non-volatile dial register encoder output, and a second electronic data register stores a value consisting of an initial value set by the dial register encoder at start-up time continuously augmented by the output of the pulse encoder since start up. Comparison and selective readout of the two electronic data registers reduces erroneous meter reading outputs.

6 Claims, 4 Drawing Figures

DUAL MODE METER READING APPARATUS

BACKGROUND OF THE INVENTION

1. Field of the Invention

This invention relates to remote meter reading and meter encoder systems and more particularly to a dual mode meter reading apparatus having at least two meter encoders for providing separate meter readings from a common integrating meter for a meter telemetering system.

2. Description of the Prior Art

In the field of remote meter reading and telemetering systems, it is generally known to equip a meter to be monitored at a remote site with various types of encoders or encoding devices. A meter encoder is usually either directly responsive to the metering status of a measuring element included in the meter to be monitored or is responsive to a dial indication of the meter. In integrating type meters including odometers and consumption meters, a shaft in the meter movement defines a meter measuring element responsive to the measured quantity increases, use or consumption. Typically, utility meters, such as used for billing and usage monitoring of electric energy, gas and water consumption, include a rotatable shaft measuring element. The rate of rotations of the measuring element is proportional to the demand or rate of usage or rate of change in the measured quantity. A mechanical dial register assembly is included in the integrating meters to provide visual totalized or integrated measurement indications in units of a standard parameter. For example, electric energy meters include dial register assembles having plural order decade-related dial indicators, typically either four or five dials, coupled by a gear train to the measuring element. The dial assemblies accumulate or totalize the measuring element rotations to provide corresponding visual numerical dial readings in kilowatthours (KWH).

Encoders for integrating meters include two general types. A first type is a dial encoder providing electronic shaft angle or shaft position encoding of each of the indicator shafts of a dial register assembly. Typically, separate binary logic words are produced for each of the dial indicators to represent the same dial meter readings available by visual observations of the dial register assembly. The dial encoders usually require shaft code elements, associated sensors, sensor scanning arrangements and coding logic. The dial encoders are advantageously used for remotely reading the same dial reading as would be required by physically observing the dial register assembly at the meter site. The dial encoder outputs are also advantageously responsive to the non-volatile readings of a relatively simple and reliable dial register assembly and not be subject to loss of data by power outages or power failures. Some disadvantages of the dial encoders include minimum low order dial resolution so that the least significant digit position in the dial indicated parameter is limited to tens or units of a parameter such as kilowatthours. Still further errors in the dial encoders are sometimes undetectable such as when misalignment occurs between a dial indicator pointer and a code element assembled to a common dial shaft. Examples of dial encoders are disclosed in U.S. Pat. Nos. 3,310,801; 3,376,567; 3,484,780; 3,662,368; 3,750,122; 3,750,156; 3,846,788; 3,846,789; and 4,037,219, the last patent being assigned to the assignee of this invention.

The second general type of meter encoder is the pulse encoder having provision for sensing metering events and generating distinct pulses each responsive to a predetermined quantum of a quantity to be measured by the associated meter. Typically, a rotating measuring element of the meter drives a pattern of indicia or drives a contact device which activates an associated sensor or switch so that pulses are generated at a rate proportional to the metering rotations of the measuring element. The pulse encoders are also referred to as pulse initiators and are widely used for different measuring and monitoring applications in utility meter systems. For meter telemetering systems, the encoder pulses are typically applied to electronic counters or accumulators. The accumulated pulses are scaled or calibrated to the parameter, such as kilowatthours, defining the measured quantity. Quite importantly, the meter pulses can be produced to provide high resolution in the accumulated meter readings. Some of the disadvantages of pulse encoders include the accumulation of meter data readings in conventional volatile electronic data registers which are subject to data loss by power outages or power failures. External and internal circuit generated noise spikes and spurious pulses and pulse threshold variations at the input to the pulse counters can often produce pulse accumulation errors or failures to accumulate valid pulses so that the accumulated meter readings are inaccurate. The aforementioned error producing conditions provide a lack of correlation between the pulse encoder accumulated readings and the mechanical indications of an associated dial register assembly. Accordingly, the dial register assemblies of meters having pulse encoders are often required to be checked more often than those meters having the aformentioned dial encoders. Examples of pulse initiators for electric energy meters are described in the "Electrical Meterman's Handbook", Seventh Edition, published 1965 by Edison Electric Institute, New York, N.Y. Further examples of pulse initiator type encoders for electric energy meters are disclosed in U.S. Pat. Nos. 3,878,391 and 3,943,498, both assigned to the assignee of this invention.

U.S. Pat. Nos. 3,820,073 and 4,130,874, both assigned to the assignee of this invention, disclose remote meter reading system communication terminal arrangements utilizing either a meter pulse encoder or a meter dial encoder for remotely reading electric energy meters. The first noted patent discloses a non-volatile solid state encoding circuit for accumulating electric energy related pulses.

SUMMARY OF THE INVENTION

In accordance with the present invention, a dual mode meter reading apparatus for meter telemetering systems includes first and second meter encoders and a store and readout control having a first meter data store and a second meter data store for separately storing and accumulating first and second coded meter readings of an integrating type meter. The two coded meter readings are electronically stored for error comparison and readout in alternative output modes. The first and second encoders are provided by dial type and pulse type encoders respectively. Both encoders are operated by the same metering responses of a measuring element included in the integrating meter but have different degrees of resolution. The measuring element is driven at a rate corresponding to the rate of occurrence of measured events to be totalized or to the rate at which predetermined quantums of a consumption quantity are detected for totalization.

In one preferred form, an electric energy meter includes a measuring element formed by a disc shaft driven electromagnetically at a rate corresponding to the rate of electric energy usage or consumption to be measured. A mechanical dial register assembly totalizes the disc shaft rotations so that plural dial indicators thereof display multiple digit numerical values in whole or integral units of the conventional kilowatthour parameter. The first encoder provides a coded representation of each dial indication for storing corresponding a first and dial totalized coded meter reading in the first electronic meter data register of the store and readout control. The second meter encoder is responsive to incremental or differential shaft rotations of the measuring element to generate pulses proportional to fractional or sub-unit values of the kilowatthour parameter. The encoder pulses are accumulated to produce the second coded meter readings in the second electronic meter data store. The second coded meter readings are characterized as pulse augmented meter readings equal to the total of an initial coded meter reading, provided by the first encoder, and the subsequently accumulated pulses produced by the second encoder. The second coded meter readings are stored in at least one least significant coded digit position having a higher resolution than does a corresponding least significant digit position of the first coded meter reading so as to provide a higher resolution in the measured kilowatthour parameter stored therein.

Upon interrogation or meter read command to the dual meter reading apparatus, the first and second meter data stores are both available to read out either of the first or second coded meter readings following comparison and error checking of the stored meter readings by the store and readout control. The first coded meter readings are restored at each meter read command. The meter dial produced coded readings are non-volatile and are always available even after power outage or power failure conditions which may erase or alter the first and second data stores in the store and readout control. The first coded meter readings are further available for output when the event pulses of the second encoder are erroneously counted or accumulated in the second meter data store. Certain visually non-detectable and non-accumulating errors of the dial encoder are detectable and corrected by reading out the second coded meter readings. The second coded meter readings also produce higher resolution in the measured kilowatthour values thereof for more accurate monitoring and readout of the electric energy quantity to be measured.

Accordingly, it is a general feature of the present invention to provide a dual mode meter reading apparatus having both high reliability and high resolution by accumulating and storing two separately coded meter readings derived independently of each other and produced in response to the same metering responses of a measuring element included in an integrating meter.

A further feature of this invention is to provide a first dial-type meter encoder and a second pulse type meter encoder each responsive to metering status changes of a measuring element being rotated at a rate proportional to increases of a quantity to be measured and to provide both a dial totalized coded meter reading and pulse augmented coded meter reading being incremented from an initial dial totalized coded meter reading. Thus, both non-volatile totalized meter values and high resolution electronic pulse accumulated meter values are provided from a common integrating meter to be interrogated for providing higher accuracy remote meter reading outputs therefrom.

A still further feature of this invention is to provide a dual mode meter reading apparatus having an improved store and readout control for providing decoding and ambiguity resolution and interdial interpolation of the dial encoder outputs to provide error correction and checking of the first coded meter readings, and for accumulating predetermined fractional parameter values producing high resolution second coded meter readings, and for providing the first and second coded meter readings with the same number of digit positions for ease of comparison checking therebetween, and still further for providing alternative meter readouts either automatically or in response to different meter read commands.

Still further features of this invention are to provide a dual mode meter reading apparatus combining the advantages of both a first dial type encoder and a second pulse type encoder so as to compensate for the limitations of each encoder including those produced by power outages, further to provide the apparatus with programmable option codes so as to be adaptable for interchangeable use with different integrating type meters especially of the electric energy type having different meter proportionality constants and pulse encoders having different pulse value constants, and still further to provide improved meter reading error detection and reporting of such detected errors when providing either of the two independently totalized and accumulated coded meter readings produced from a common integrating meter to be read remotely by a meter telemetering system.

These and other features and advantages of the present invention will become apparent from the detailed descriptions of the preferred embodiments of the present invention as shown in the drawings.

DESCRIPTION OF THE PREFERRED EMBODIMENTS

Figure 1:
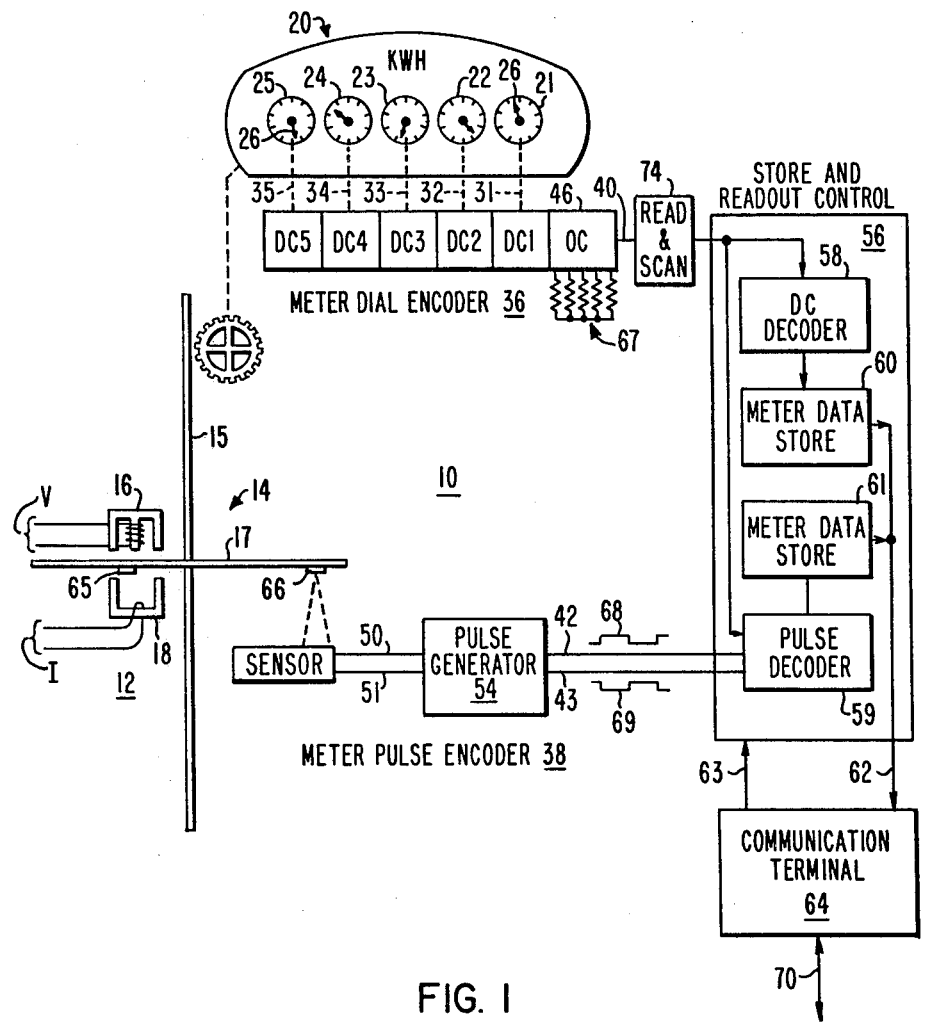
FIG. 1 is a schematic diagram, partially in block diagram form, illustrating a dual mode meter reading apparatus made in accordance with the present invention.

Referring now to the drawings wherein the same reference numeral designates like or corresponding parts, and more particularly to FIG. 1, a dual mode meter reading apparatus 10 is shown made in accordance with the present invention for use with an integrating meter 12 formed by an electric energy type meter. The meter 12 is a well-known type having a measuring element 14 formed by a rotatable shaft 15 which is carrying an electroconductive disc 17 electromagnetically driven by voltage and current electromagnetic sections 16 and 18 of the integrating induction meter type. A pair of power conductors, not shown, extending between an electric energy source and an electric load, both not shown, have applied thereto a voltage component V and a current component I of an electric energy quantity to be measured by the meter 12. Accordingly, the voltage and current sections 16 and 18 are connected as shown in FIG. 1 for connecting the meter 12 to the voltage V and current I components of the quantity to be measured in kilowatthours (KWH).

A dial register assembly 20 is mechanically linked to the rotations of the measuring element 14 for totalizing the revolutions of the measuring element 14 as the electric energy quantity to be measured is consumed or used. Accordingly, the time integral of the product of the voltage component V and the current component I is totalized at the dial register assembly 20. Plural order dials 21, 22, 23, 24 and 25 of the dial register assembly 20 have associated dial indicators each formed by a pointer 26 carried on a shaft represented by broken lines 31, 32, 33, 34 and 35 associated with a separate one of the dials 21 through 25. Typically, either four or five dials are provided in the dial assembly 20 wherein each dial has a set of equally circular disposed decimal numerals zero through nine. The five decimal dials 21 through 25 shown in FIG. 1 provide five dial positions for indicating the meter measurements in units, tens, hundreds, thousands, and ten thousands digits of kilowatthours (KWH) in a known fashion. As is further known, different predetermined proportionality constants exist for different ones of the meter 12 and are described in the aforementioned "Electrical Meterman's Handbook" at pages 714 through 720. These constants include a disc or watthour constant Kh which is the number of watthours (wh) represented by one revolution of the measuring element 14. Also, register ratio constants are also provided for the dial register assembly 20 related to the ratio of revolutions of an input gear thereto for one revolution of the lowest order dial 21.

Having described the general characteristics of the integrating meter 12 including the dial assembly 20 and the electric energy consumption or usage quantity to be measured thereby, the general arrangement of a dual mode meter reading apparatus 10 is described as further shown in FIG. 1. A first meter encoder 36 and a second meter encoder 38 are suitably mounted on the meter 12 so that both are responsive, each in a different manner, to the metering status changes or rotations of the meter measuring element 14. The first encoder 36 is a dial encoder and the second encoder 38 is a pulse encoder, both of known types. The dial and pulse encoders 36 and 38, respectively, provide measured data outputs 40, 42 and 43 as shown in FIG. 1 having binary coded representations described further hereinbelow.

The dial encoder 36 includes a shaft coding assembly 46 providing the measured data output 40.

The pulse encoder 38 includes a rotation responsive sensor 48 providing impulse inputs 50 and 51 to a pulse generator 54. A store and readout control 56 receives the encoder data outputs 40, 42 and 43. The control 56 provides binary data storage and logic operations and further processes encoder input data and meter output data.

The control 56 generally includes a dial code (DC) decoder 58, a pulse decoder 59, and first meter data store 60, and second meter data store 61. A meter data out output 62 and meter read command input 63 at the control 56 are for interfacing or connecting to a communications system at link 70 having a remote meter reading or meter telemetering operation and including a communications terminal 64, not forming a part of the present invention. The detailed features and operations of the store and readout control 56 are further described below in connection with the description of FIGS. 2 and 4. It s briefly noted that the communications terminal 64 may include one type of such terminals as disclosed and claimed in the aforementioned U.S. Pat. No. 4,130,874 for a load management terminal or, alternatively, a meter data receiving or recording circuit device.

Figure 2:
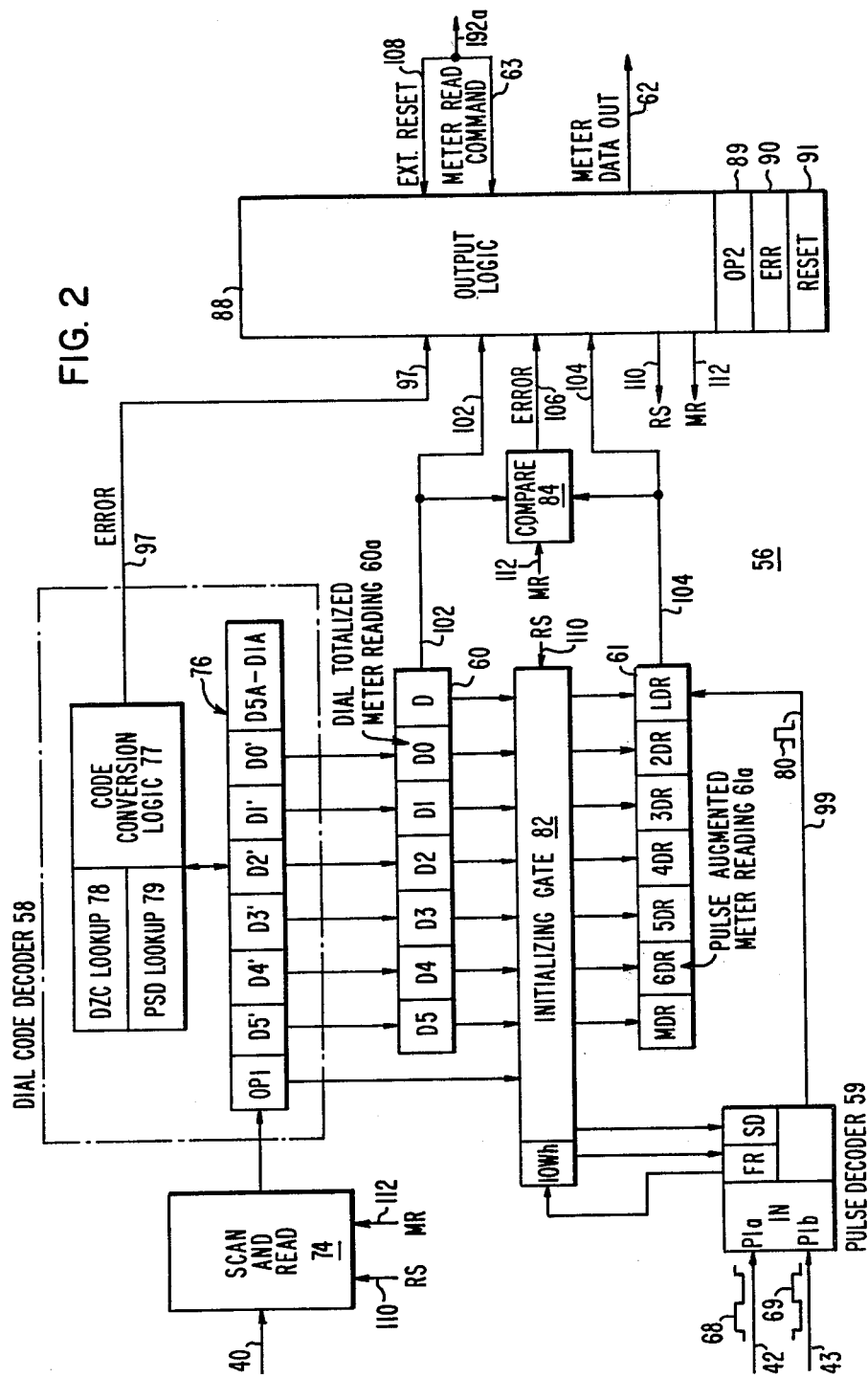
FIG. 2 is a function block diagram of a store and readout control included in the apparatus shown in FIG. 1.
Figure 4:
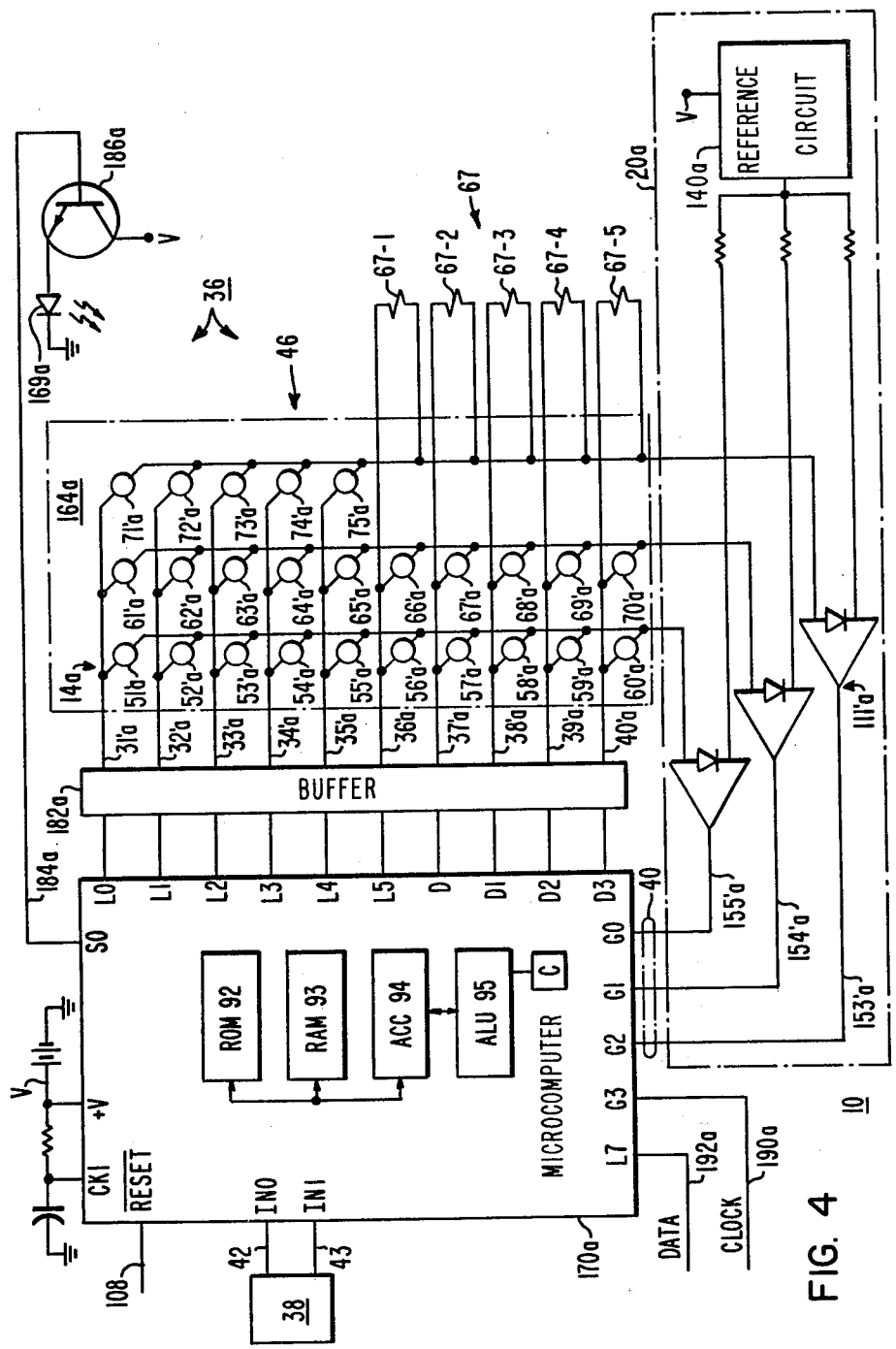
FIG. 4 is an electrical schematic diagram of one preferred embodiment of the apparatus shown in FIGS. 1 and 2.

Since the output characteristics of the dial encoder 36 and pulse encoder 38 as shown in FIG. 1 are significant to the organization and operation of the store and readout control 56, shown in FIG. 2, the general characteristics of the encoders 36 and 38 are now briefly described before describing in detail the control 56. Typically, the dial encoder 36 is formed to have the general features as described in detail in the aforementioned U.S. Pat. Nos. 4,037,219 and 4,137,451 also disclosing dial code scanning and readout arrangements. Preferably an improved matrix encoder for resistive sensor arrays as described and claimed in U.S. Pat. No. 4,374,384, assigned to the assignee of this invention, is included in the present invention as shown in FIG. 4. The encoder 36 has, in the coding assembly 46, also in FIG. 4, a shaft angle or shaft position code element, not shown, associated with each of the shafts of the dial indicators 31 through 35 as noted in the aformentioned patents. Each code element has a set of five sensors included in the coding assembly 46 associated therewith for encoding twenty angular positions of each dial indicator. Accordingly, a two-or-three-out-of-five binary dial code, described further hereinbelow, is provided to define twenty distinct positional zones for each dial indicator pointer 26 as also described in the aforementioned U.S. Pat. No. 4,037,219. The measured data output 40 of the encoder 36 includes twenty-five bits of meter dial code information provided by five, five bit dial code logic word blocks DC1, DC2, DC3, DC4 and DC5 for each dial indication produced in assembly 46. The binary one or zero state of each sensor is produced as also described in the aforementioned U.S. Pat. No. 4,037,219 or as described in the aforementioned patent application and utilized in the embodiment of the present invention shown in FIG. 4. The measured data output 40 further includes a programmable five bit option code logic word OC representing a preselected pulse scaling four bit data word for interpreting the pulse values produced by the pulse encoder 38 and a fifth bit indicating an optional mode of data output, if desired. The pulse scaling data, as described more fully below, is required for defining both different ones of meter constants Kh for different types of the integrating meter 12 and for different pulse constants Mp included in different ones of the pulse encoder 38. Five resistor positions shown in the programmable network 67 at the logic word block OC provide the desired option code in the assembly 46.

The pulse encoder 38 is preferably a pulse initiator type disclosed and claimed in the U.S. Pat. Nos. 3,878,391 and 3,943,498, noted above. Such pulse initiaor type encoders include the sensor 48 having two source-pickup pairs optoelectronically responsive to one or more pairs of reflective segments or indicia, such as indicated by numerals 65 and 66 carried by the disc 17 of the shaft 15, rotated in response to the metering rotations of the measuring element 14. The sensor 48 produces impulses on the inputs 50 and 51 to the pulse generating circuit or generator 54. The pulse generator 54 produces two pulses 68 and 69 on the outputs 42 and 43, respectively, in accordance with the outputs of such pulse initiators and in accordance with well-known principles of three-wire telemetering systems. Thus, the pulses 68 and 69 represent measured events corresponding to the measuring element 14 being rotated by the consumption of a predetermined quantum of electric energy. As described in detail in the aforementioned U.S. Pat. No. 3,943,498, the encoder 38 has a predetermined pulse initiator constant Mp representing the extent of shaft rotation or revolution of the measuring element 14 for generating pulses 68 and 69. The quantum of electric energy or pulse energy value represented by each of the pulses is designated as the pulse energy value K3 (watthour/pulse) and is equal to the pulse initiator constant Mp times the meter constant Kh, or Ke equals Mp×Kh. Typically, the pulse energy value Ke represented by the pulses 68 and 69 are fractional or sub-unit values of the KWH indication at the lowest order dial 21 of the dial register assembly 20 and correspondingly included in the dial code logic word produced thereby as the least significant dial code DC1 in the data output 40 of the dial encoder 36. As noted above, different pulse energy values or constants Ke are provided for different ones of the integrating meter 12 and the pulse initiator arrangement of the encoder 38. Also, different numbers of pairs of the indicia 65 and 66 are also provided at the pulse encoder 36. Accordingly, a corresponding option code is provided in the logic word block OC of the coding assembly 46 for inclusion in the data output 40.

Typically, energy pulse constant Ke values for the pulses 68 and 69 are less than ten watthours (Wh) of energy consumption per pulse. Correspondingly, the lowest order dial 21 of the dial register assembly 20 has the dial numerals thereof for indicating each one-tenth of a revolution of the associated dial indicator or pointer 26 thereof which typically represents one KHW or one thousand watthours (Wh). Thus, the resolution of the metering or rotation of the measuring element 14 is indicated at a much higher resolution by the pulses 68 and 69 than are the dial readings at the lowest order dial 21 of the dial assembly 20. Since the dial code logic word DC1 produced by the lowest order dial 21 of the dial assembly 20 at the dial encoder 36 has the same resolution as at the associated dial, the pulses 68 and 69 produced by the pulse encoder 38 have a much higher resolution. The dial and pulse encoder readings are uniquely correlated and compared in accordance with the present invention as described more fully below in connection with the store and readout control 56.

Referring again generally to FIG. 2 wherein the store and readout control 56 is shown, the functional block diagram therein illustrates one form which can be provided by known dedicated digital logic and memory circuits and, preferably, is provided in a corresponding manner by the circuit arrangement of the dual mode meter reading apparatus 10 shown in FIG. 4. The apparatus circuit arrangement shown in FIG. 4 has the present invention added to that described and claimed in that aforementioned U.S. Pat. No. 4,374,384 which already incorporated a dial encoder such as encoder 36 in one form thereof. The identical parts of the circuit arrangement of the apparatus 10 in FIG. 4 are designated by the same reference numerals as in the aforementioned application with an "a" added to the numeral in FIG. 4 to aid in designating the same parts described more fully therein. In the correspondence in reference numbering in FIG. 4 the assembly 46 of encoder 36 also shown in FIG. 1, includes the sensor array 164a of the aforementioned application. The microcomputer 170a is connected to the circuit matrix 14a of the assembly 46 and the detecting circuit 20'a at the output conductors 153'a, 154'a and 155'a (corresponding to output 40 in FIGS. 1 and 2), and are the same microcomputer 170, sensor matrix 14a, detecting circuit 20' and outputs 153', 154' and 155' as described in the aforementioned application. The circuit arrangement of apparatus 10 in FIG. 4 is made in accordance with the present invention as shown in FIGS. 1 and 2 by connection of the encoder 38 to the microcomputer 170a as shown in FIG. 4 and the addition of the programmable resistor network 67. The network 67 is formed by predetermined combinations of five resistor positions 67-1, 67-2, 67-3, 67-4 and 67-5 connected to the matrix 14a of the assembly 46. Since there are thirty matrix locations to be scanned in the matrix 14a and there are only twenty-five opto-electronic sensors connected in the matrix 14a, different ones of the five resistor positions 67-1 through 67-5 may be disconnected to form different programmed combinations of resistors to form different fixed binary one and zero states when the matrix 14a is scanned in accordance to the teaching of U.S. Pat. No. 4,374,384. Thus, the option code logic word OC is provided for the coding assembly 46 shown in FIG. 1.

The store and readout control 56 as shown in FIG. 2, receives the dial encoder 36 output 40 at a scan and read block 74. The pulse encoder 38 measured data outputs 42 and 43 are received at the meter pulse decoder 59. The dial code logic signals from the block 74 are applied to the dial code (DC) decode block 58 which initially stores the dial codes in a scratch pad or temporary data storage 76. A code conversion logic block 77 in the decoder 58 produces binary coded decimal (BCD) decoding and interdial code interpretations of the dial codes received from the encoder 36. A dial zone code (DZC) lookup table 78, including the data of Table II hereinbelow, and pulse scaling data (PSD) lookup table 79 are used by the conversion logic 77 to provide operation of the decoder 58. A first and dial totalized coded meter reading 60a is produced by the decoder 58 and is stored in the first meter data store 60. The pulse decoder 59 provides pulse value correlation and scaling to produce incrementing or masuring event pulses 80 having a predetermined fractional value of the lowest resolution of the lowest digit of the reading stored in the first meter data store 60. The pulses 80 are accumulated and counted in a second meter data store 61 which stores therein a pulse augmented coded meter reading 61a. The second data store 61 is initialized with an initial reading from the second data store 60 through gate 82 so that the pulses 80 increment an initial dial totalized coded meter reading obtained from the dial encoder 36. The first and second coded meter readings of the first and second data stores 60 and 61 are compared at a compare logic 84. If the two coded meter readings are equal, within a predetermined tolerance range, the pulse augmented coded meter reading 61a of the second data store 61 produces the external meter reading output of the control 56. Alternatively, if the first and second coded meter readings do not compare the first and dial totalized coded meter reading 60a of the meter data store 60 provides the external meter reading output of the control 56. An output logic block 88 receives the meter read command input 63 and produces the meter data output 62 in accordance with the operation of the store and readout control 56 as described in detail hereinbelow. Having briefly reviewed the principal parts and general operation of the control 56, a detailed description thereof is provided below.

Referring now in particular detail to the store and readout control 56 shown in FIG. 2, the block diagram includes a number of electronic data registers which are tabulated in Table I. A number of arithmetic and logic functions are also provided in the control 56. The data registers and functional operations of the readout control 56 are provided in the microcomputer 170a shown in FIG. 4 which is a COP 420 available from the National Semiconductor Corporation, Santa Clara, California and described in the National Semiconductor 1980 MOS Data Book. As described in the aforementioned Data Book publication, the microcomputer 170a includes a program memory ROM 92, data memory RAM 93, an accumulator ACC 94 and a arithmetic logic unit ALU 95 providing addition, binary subtraction, complement, exclusive OR, clear operations and outputs a carry bit C. The RAM 92 included in the aforementioned microcomputer includes sixty-four four-bit data word registers including the data tabulated below in Table I and shown in corresponding data register blocks in FIG. 2.

TABLE I

DATA MEMORY TABLE

| DATA REG. | Description | | |
|---|---|---|---|
| Meter Data Store 61 | | | |
| MDR | Pulse Augmented M. Reading BCD | (m.s.d.) | 10,000's KWH |
| 6DR | " | (6th d.) | 1,000's KWH |
| 5DR | " | (5th d.) | 100's KWH |
| 4DR | " | (4th d.) | 10's KWH |
| 3DR | " | (3rd d.) | 1's KWH |
| 2DR | " | (2nd d.) | 1/10th's KWH |
| LDR | " | (l.s.d.) | 1/100th's KWH |
| Temp. Storage 76 | | | |
| OP1 | Option | | |
| D5' | Dial Code/DZC lo | (m.s. dial 25) | |
| D4' | " | (4th dial 24) | |
| D3' | " | (3rd dial 23) | |
| D2' | " | (2nd dial 22) | |
| D1' | " | (l.s. dial 21) | |
| D0' | " | (0 or .5) | |
| D5A | " | Mod. bit/DZC hi | (m.s. dial 25) |
| D4A | " | " | (4th dial 24) |
| D3A | " | " | (3rd dial 23) |
| D2A | " | " | (2nd dial 22) |
| D1A | " | " | (l.s. dial 21) |
| Meter Data Store 60 | | | |
| D5 | Dial Totalized M. Reading BCD | (m.s.d.) | 10,000's KWH |
| D4 | " | (6th d.) | 1,000's KWH |
| D3 | " | (5th d.) | 100's KWH |
| D2 | " | (4th d.) | 10's KWH |
| D1 | " | (3rd d.) | 1's KWH |
| D0 | " | (2nd d.) | 0 or .5 KWH |
| D | " | (l.s.d.) | 0 KWH |
| Pulse Decoder 59 | | | |
| IN | Pulse Ia or Pulse Ib pulse logic | | |
| SD(SDH) | Pulse Scaling Data (PSD) (m.s.d.) | | |
| SD(SDL) | Pulse Scaling Data (PSD) (l.s.d.) | | |
| FR(FRH) | Fractional Remainder Ten Wh (m.s.d.) | | |
| FR(FRL) | Fractional Remainder Ten Wh (l.s.d.) | | |
| Output Logic 88 | | | |
| OP2 | b1 - compare | | |
| " | b2 - Read Coded Meter Reading | | |
| FLG | b1 - Reset | | |
| ERR | b0 - Power Out (F0) | | |
| | b1 - Meter readings compare error (F2) | | |
| | b2 - Dial code error (F1) | | |

The measured data output 40 from the coding assembly 46 of the dial encoder 36 is scanned and detected at the scan and read block 74 and is performed as shown in FIG. 4 and described in the aforementioned U.S. Pat. No. 4,374,384. Thus, the five dial codes are initially detected in five dial code digit positions of the logic words DC1, DC2, DC3, DC4 and DC5 corresponding to the five decimal dial positions of the dial register assembly 20. The twenty-five dial codes are then stored in the temporary storage 76 of the decoder 58 and the individual data word registers D5', D4', D3', D2' and D1' and in one bit of each of the registers D5A, D4A, D3A, D2A and D1A. The four most significant bits of the two or three-out-of-five bit dial or shaft codes of each dial are stored in registers D5' through D1'. Thus, the dial code of the highest order dial, DC5, is stored in the register D5'. The fifth and one least significant bit of each of the dial codes is a modifying (mod.) bit stored in one bit position of each of the registers D5A through D1A. Thus, the modifying bit of the dial code D5 is stored in register D5A. The twenty-five bits of the five dial code five bit logic words (DC5-DC1) are produced by the twenty-five code pattern sensors 51'a through 75'a included in the array 164a of the coding assembly 46 as shown in FIG. 4 and are detected in the detector circuit 20'a and read in at the output conductors 153'a, 154'a and 155'a providing the output 40 as described in the aforementioned patent application.

The data word register 0P1 in temporary storage 76 receives the five bit option code produced by the programmable network 67 as shown in FIG. 4 to provide a five bit option code logic word OC. The scaling code is provided in four bits thereof for the particular pulse encoder 36 and meter 12 as described hereinabove and represents the Ke value proportional to Mp×Kh. The code conversion logic 77 converts the four scaling bits of the option code to an eight bit pulse scaling data (PSD) stored in lookup table 79 provided in ROM 92. PSD is stored in a two's complement thereof after being applied through the initializing gate 82 and into the SD registers of the pulse decoder 59 for operation as described more fully hereinbelow. The fifth bit of the OC logic word can be stored in one bit of the RAM 93 included in the output logic block 88 to designate whether the meter data output is to be in a binary or binary coded decimal (BCD) format which does not form part of this invention.

Following the loading of the five digit positions of the dial codes DC5 through DC1 in the data word registers D5' through D1' and D5A through D1A, the dial codes are decoded and interpreted by the code conversion logic 77. In the Table II hereinbelow is shown the complete range of each two-or-three-out-of-five binary dial code (DC5-DC1) which is produced for each of the twenty different dial indications of each of the decimal dials of the dial register assembly 26.

Figure 3:
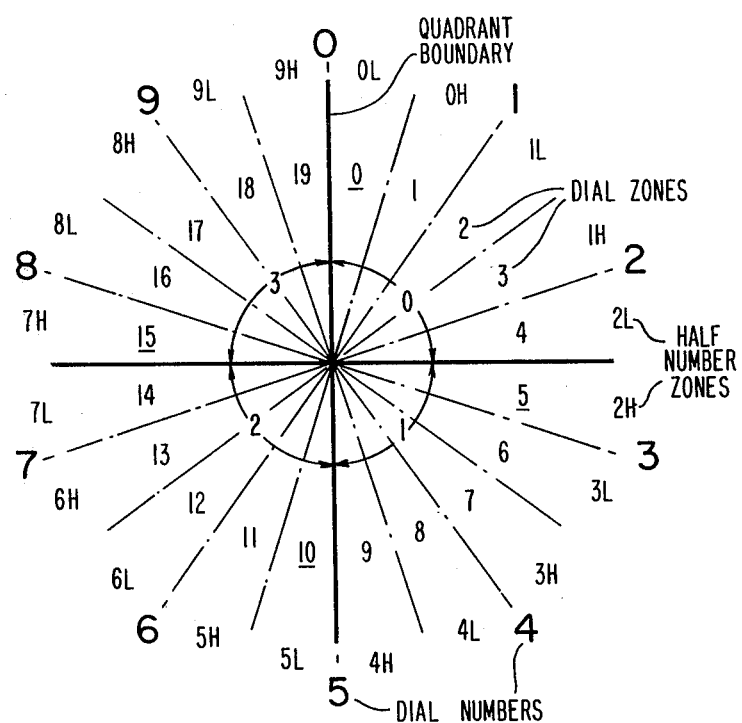
FIG. 3 is a schematic diagram illustrating the decimal dial indication zones of a dial encoder shown in FIG. 1 and the designations thereof for providing corresponding binary dial codes.

In FIG. 3 is shown a diagram of the shaft coding system used for encoding each of the dial indications and is generally described in the aforementioned U.S. Pat. No. 4,027,319. Each dial indication is encoded into one of twenty different positions and includes two half number zones between each of the decimal numerals of each dial as shown in FIG. 3. These zones are designated zero through nineteen as shown so that two adjacent ones of the half number zones are between adjacent dial numerals, one being designated a low (L) zone and the other a high (H) zone. For example, zones 2 and 3 correspond to zones 1L and 1H. The diagram of FIG. 3 also has two orthogonal quadrant reference boundaries dividing the twenty dial zones into four equal quadrants of five zones each. These are designated as quadrants 0, 1, 2 and 3. Also specially designated in FIG. 3 are the four zones zero, five, ten and fifteen which are the lowest or clockwise beginning dial zone of each quadrant. The foregoing characteristics of the dial zones shown in FIG. 3 are coded as dial zone codes (DZC) in the lookup table 79 provided in the code conversion logic 78 and in a read only memory ROM 92 of the aforementioned microcomputer 170a shown in FIG. 4. Thus, the two-or-three-out-of-five dial codes are indicated in Table II and the corresponding half number zones of the decimal dial indications and the corresponding dial zones are listed on the lefthand side thereof and the corresponding dial zone code (DZC), stored in the lookup table 78, is listed at the righthand of Table II in hexidecimal ($) numbers.

TABLE II

| Half Number Zones | Dial Zone | 2-or-3-out-of-5 Dial Code (DC5-DC1) | Dial Zone Code (DZC) |
|---|---|---|---|
| 0L | 0 | 0 1 0 0 1 | $20 |
| 0H | 1 | 1 1 0 0 1 | $10 |
| 1L | 2 | 1 1 0 0 0 | $01 |
| 1H | 3 | 1 1 0 1 0 | $11 |
| 2L | 4 | 1 0 0 1 0 | $02 |

TABLE II-continued

| Half Number Zones | Dial Zone | 2-or-3-out-of-5 Dial Code (DC5-DC1) | Dial Zone Code (DZC) |
|---|---|---|---|
| 2H | 5 | 1 0 0 1 1 | $72 |
| 3L | 6 | 1 0 0 0 1 | $43 |
| 3H | 7 | 1 0 1 0 1 | $53 |
| 4L | 8 | 0 0 1 0 1 | $44 |
| 4H | 9 | 0 0 1 1 1 | $54 |
| 5L | 10 | 0 0 0 1 1 | $A5 |
| 5H | 11 | 0 1 0 1 1 | $95 |
| 6L | 12 | 0 1 0 1 0 | $86 |
| 6H | 13 | 0 1 1 1 0 | $96 |
| 7L | 14 | 0 0 1 1 0 | $87 |
| 7H | 15 | 1 0 1 1 0 | $F7 |
| 8L | 16 | 1 0 1 0 0 | $C8 |
| 8H | 17 | 1 1 1 0 0 | $D8 |
| 9L | 18 | 0 1 1 0 0 | $C9 |
| 9H | 19 | 0 1 1 0 1 | $D9 |

The conversion operation in the logic 77 includes transforming the dial code logic words DC5 through DC1 into the eight bit dial zone binary code DZC shown in two hexadecimal digits at the righthand-most part of the Table II. The data word registers D5' through D1' receive the m.s.d. of the corresponding dial zone code (DZC hi) and the l.s.d. of the dial zone code (DZC lo) is stored in the corresponding one of the four bit data word registers D5A through D1A. Any invalid codes or impossible code states of the two-or-three-out-of-five dial code are detected by the logic 77 and dial code error output 97 is provided therefrom. Further interdial interpolation and ambiguity resolution is provided in the logic 78 using the converted dial zone code (DZC) shown in the righthand portion of the Table II. The data word register D0' in storage 76 is stored as either a decimal "zero" or a "five" in BCD format indicating either zero or five hundred watthours or one-half KWH which is the highest resolution of the low order dial 21 available from the two-or-three-out-of-five dial code produced by the dial encoder 36.

The eight bit dial converted code of two adjacent dials are compared in the logic 77 after all of the five codes for the five dial positions have been read in the two-or-three-out-of-five dial code format and converted to the eight bit (b7-b0) converted dial zone code (DZC) format. Thereafter, each two adjacent dial position codes are compared and adjusted to eliminate zone transition ambiguity.

In general, for two adjacent dials M (the more significant) and L (the least significant) a low zone reading of M is correct if L is in quadrants 0 or 1; M must be decreased by one zone if L is in quadrant 3; or M must be increased by one zone if L is in quadrant 2. Similarly, a high zone reading of M is correct if L is in quadrants 2 or 3; must be decreased by one zone of L is in quadrant 1; or must be increased by one zone if L is in quadrant 0.

The code conversion logic 77 performs the necessary zone corrections starting with D1 and progressing to D5. By way of example, a reading of 9H, 9H, 9H, 9H and 0L, for dials 5 through 1, respectively, is converted to 0L, 0L, 0L, 0L and 0L following correction by the code conversion logic. The final meter reading is then obtained by dropping the half zone portion of the reading on all but the least significant dial, where a low 0 is interpreted as 0 and a high zone is interpreted as 0.5.

Following the conversion of each of the decimal dial coded positions as described above, one of the BCD coded values corresponding to the appropriate measured decimal dial indication will be stored in each of the data word registers D5' through D1'. Also the D0' data word register will be stored with either a binary zero or binary coded decimal five as described above if the dial indication of the low order dial is in a low zone or high zone, respectively, of the two adjacent half number zones forming the two zones between adjacent dial decimal numerals. Following the above-described code conversion and interpretation operations by the code conversion logic 77, the BCD coded values of registers D5' through D0' are loaded into the first meter data store 60 at the corresponding data word registers D5, D4, D3, D2, D1 and D0 as shown in FIG. 2. In operation of the microcomputer 170a, the interpreted and converted values may be shifted one place to the right in the temporary storage 76 so that the register indicated as 0P1 becomes the register D5 shown in register 74 and correspondingly the register D5' becomes the register D4, and so forth, so that separate registers for data store 60 are not needed to conserve the number of data registers required in the RAM 93. The first meter data store 60 then contains the first and dial totalized coded meter reading which further includes a binary zero in the data register D. The registers D5 through D1 have dial data corresponding to the five decimal dials 25 through 21 of the dial register assembly 20 plus a zero or one-half resolution indication 0.5 KWH) of the low order dial 21 in the data word register D0. The seventh and least significant digit register D is provided so that there is seven digit positions in the storing of the dial totalized coded meter reading 60a so as to correspond exactly to the seven digit positions of the pulse augmented coded meter reading 61a store in the second meter data store 61 as described below.

Referring now to the processing of the pulse encoder measured data output at the encoder 38 outputs 42 and 43 including the meter pulses 68 and 69 applied to the pulse decoder 59. The IN register has bits b0 and b1 set and reset (binary one and zero) in response to the high and low levels of the pulses 68 and 69 applied to the microcomputer inputs IN0 and IN1. A latching operation is provided in the decoder 59 to respond only after two transitions between the one and zero states at the b0 and b1 bit positions corresponding to the PIa and PIb inputs. The latch operation prevents pulse "jitter" and effectively multiplies the Ke pulse constant value by two.

The pulse scaling data (PSD) is loaded into the eight bit word register SD of the decoder 59 listed in Table I hereinabove and has different values proportional to the pulse energy or pulse measuring parameter represented by the pulses 68 and 69 applied to the PIa and PIb inputs to the IN data word register of the decoder 59. For example, for a meter 12 having a meter constant Kh of 7.2 and a pulse constant of one-half, the resultant pulse constant Ke is equal to 3.6. The option code logic word OC provided by network 67 at the assembly 46 of the encoder 36 would produce a corresponding code of 1 1 1 1, for example, which is decoded in the PSD look-up table 79 by the code conversion logic 77 as an eight-bit hexadecimal pulse scaling data code of $48. Other Ke constants can be programmed by network 67 for the option code OC. For example, Ke constants of 1.2, 1.8 and 2.7 can be coded in OC by 1 0 1 0, 1 1 0 1 and 1 1 1 0, respectively. The corresponding PSD codes stored in the look-up table 79 would be $0C, $12 and $36, respectively. The $48 corresponds to a PSD code equal to decimal number seventy-two. The logic circuit 77 converts the PSD code to the two's complement which is hexadecimal $B8, as the value stored in the eight bit register SD in the decoder 59. The decoder 59 performs a modulo counter operation noted below. The fractional remainder register FR is initially stored with decimal one hundred or the binary code of hexadecimal $64. A two's complement subtraction operation is performed in decoder 59 at the ALU 95 in response to each latch response produced by two consecutive pulses received at PIa and PIb at the IN data word register. The subtraction of or decrement of the value in the SD register from the remainder value in the FR register produces a new remainder. The value initially in the FR register represents a predetermined fractional value of the low order decimal dial 21 of the dial register assembly 20 and in particular the decimal one hundred number represents ten watthours (Wh) or one-hundredth of each decimal unit of KWH read by the low order dial 21. The value of the pulses 68 and 70 are represented by the two's complement value in the SD register representing a pulse scaling of seventy-two which is subtracted from the value in the FR register by two's complement subtraction. Decimal numbers one hundred and seventy-two are used rather than ten and 7.2 to avoid decimal point arithmetic.

For each ten watthour value counted at the pulse decoder 59, a measuring event pulse 80 is produced at the output 99 thereof to increment the register 61. For example, the modulo counter operation is provided after the first two pulses are received at the IN register after initializing the fractional remainder register FR. The hexadecimal value $1C will remain in the FR register and the carry bit C of the microprocessor 107a will be set indicating that no pulse 80 is to be initiated at the output 99. The next two pulses 68 and 69 produce a subtraction result $D4 with no carry C out so that a pulse 80 is initiated to increment the LDR register of meter data store 61 and the subtraction remainder in the register FR is again incremented by decimal one hundred ($64) so that a hexadecimal result of $38 or decimal fifty-six remains in FR indicating that ten watthours of the measured 14.4 Wh is represented by the pulse 80 and that the excess 4.4 watthours are kept in register FR after the subtraction of the pulse energy values of four transitions in the pulses 68 and 69 produced in response to the two disc 17 revolutions of the measuring element 14 in FIG. 1.

Referring now to the second meter data store 61, it is initialized from the initializing gate 82 which loads directly the contents of the first meter data store 60 having the identical seven digit positions encoded in the BCD format as noted hereinabove. Accordingly, the D5 through D1 data word registers of the data store 60 are applied to the data word registers MDR through LDR, respectively, as shown in FIG. 2. Accordingly, each pulse 80 increments the LDR register by a value of ten watthours or 1/100th's of the KWH unit values indicated at the low order dial of the dial register assembly 20. The 2DR register and LDR register will be initially loaded with either decimal 00 or 50, respectively, and then the register LDR will be incremented by one BCD number representing the ten watthour values of the pulses 80. Thus, the second meter data source 61 provides a higher resolution BCD coded meter reading than does the first meter data store 60. At a time for providing a meter reading readout, as described more fully hereinbelow, the coded meter readings of the meter data store 60 and store 61 are applied to the outputs 102 and 104 thereof. The compare logic 84 receives the outputs 102 and 104 and which performs an absolute subtraction operation. If the difference thereof is within two watthours, a compare error false logic state is produced at the output 106 of the compare logic 84. A compare error true logic state is produced at the logic 84 output 106 when the difference between the two coded meter readings is more two watthours.

Referring now to the output logic 88 of the store and readout control 56 shown in FIG. 2, the logic block 88 includes the status and error flag data word registers 89 (OP2), 90 (ERR), and 91 (RESET) listed hereinabove in Table I. The external inputs and outputs at the output logic block 88 are to provide data processing between the communications terminal 40, shown in FIG. 1 and the desired readout response in the control 56. The output logic 88 receives the code comparison error logic on the output 97 from the code conversion logic 77 and the compare error logic on output 106 from the compare logic 84 to set bits b2 and b1 in the ERR register 90. The logic 88 receives the first or second coded meter readings 60a and 61a on the outputs 102 and 104 from the first and second meter data stores 60 and 61 for readout thereof at the meter data out output 62 in a predetermined serial message word format. The external input/outputs to the output logic 88 include the aforementioned meter read command input 63 and meter data out output 62. An external (ext.) reset input 108 may be provided which is provided by the activation of the RESET input to the microcomputer 107 as shown in FIG. 4. The output 62 from the logic output 88 includes a predetermined message data word for transmission to the terminal 64 and the associated meter telemetering system. The message word format of the output 62 includes at least thirty-four bit cells or bit positions in which the b0 and b1 bit positions provide start bits, the position b2 provides a data word identifier, the bit positions b3, b4 and b5 provide three output error flags designated F2, F1 and F0, respectively. The F1 message flag indicates that an error occurred in the dial code conversion logic operations and is set in response to a binary one at b2 in the ERR register. The F2 message flag indicates that the first and second coded meter readings did not compare when compared at the logic 84 and is set in response to a binary one at b1 in the ERR register. The F0 message flag indicates that a reset and initialization mode of operation has occurred in the control 56 and is set in response to a binary one at b0 in the ERR register. The message word bit positions b6 through b33 provide twenty-eight bit positions for reading out the coded meter reading BCD values of either the meter data store 60 or the store 61. Thus each of the seven digit positions of the first or dial totalized and second or pulse augmented coded meter readings 60a and 61a can be read out in a four-bit BCD manner.

The interrogate or meter read command input 63 includes a three bit logic word defining one of at least five read commands and different modes of meter reading data readout at output 62 from the control 56. It is initially noted that internal control logic outputs RS and MR at internal outputs 110 and 112, respectively, of logic 88 represent functional operations initiated and controlled by the store and readout control 56 in response to the command input 63 and an automatic power-reset condition. The RS control logic is initiated in response to external input 108 and preselected ones at input 63 and following a power outage condition whereupon the RESET register 91 is set to binary one and this outputs the RS control logic. The power-up reset is initiated by an internal reset logic in the microcomputer 170a. In general, the reset operation, started in one of the three aforementioned ways, clears the microcomputer 170a registers and clears RAM 93 when the address 0 of ROM 92 is addressed. The data constants of ROM 92 are loaded in the RAM 93. The power out bit b0 in the ERR register 90 is set and the reset bit b1 in the reset register 91 is set. The RS logic output 110 produces initialization of the store and readout control 56. The RS logic output is shown in FIG. 2 being applied to the scan and read block 74 and the initializing gate 82 to effect the reading in of the encoder 36 data output 40 and the aforementioned code conversion in the dial code decoder 58 and subsequent initialization of the meter data stores 60 and 61 and of the pulse decoder 59. The program sequence in the ROM 92 is then reached to effect accumulation of the pulse encoder 38 data outputs 42 and 43 and respond to a meter read command input 63. The RESET register 91 is reset to zero and the power-out bit b0 remains set in ERR. The internal logic control MR output 112 is responsive to one of the aforementioned five read commands included in the three bit logic word of the read command input 63.

In accordance with the above, the dual mode meter reading apparatus 10 of the present invention is operated in three general modes of operation which are as follows: a first mode is the reset and initialization following initial setup and operation of the apparatus or following a power outage (power-up reset), external reset input 108 or a reset command at input 63; a second mode is the normal meter reading accumulating mode of operation in which the rotation of the measuring element 14 of the meter 12 produces pulses 68 and 69 for data accumulation in the second meter data store 61; and a third mode is the readout mode of operation which is provided for reading internal registers of the microcomputer 170a as is necessary in manufacturing and testing of the completed metering unit. A typical mode of readout provides the aforementioned compare of the current coded meter reading in the first and second meter data stores 60 and 61 and when within the compare limits, within plus or minus one kilowatthour, the higher resolution pulse augmented coded meter reading 61a of the second meter data store 61 is output. If there is a compare logic error, the first and dial totalized coded meter reading 60a of the first meter data store 60 is output. In the alternative forms of the readout mode of operation, the coded meter readings of either the first and second meter data stores 60 and 61 are read out in a BCD format in the message data word at the meter data out output 62.

A brief summary of the operation of the apparatus 10, is made referring to FIG. 4 keeping in mind the corresponding functions and operations shown in FIG. 1. Reset initiates the initialization of the control 56 and microcomputer 170a which includes the power-up reset sequence of operation provided internally for the microcomputer 170a or a logic zero is applied to the RESET pin by input 108. The accumulator ACC 94, and other microcomputer registers are cleared, the LED 184a output is disabled and the data line output 63 is tri-stated. The clock line 190a is pulled low and the microcomputer 170a assumes a power initialized condition. In each of the reset conditions the beginning address 0 of the program sequence of operation stored in the microcomputer's ROM 92 is addressed. The RAM 93 data memory is cleared and the program constants from the ROM 92 are transferred to the RAM 93. The power out flag at bit position b0 in the ERR register 90 is set as is the reset register 91. The LED 169a is turned on and the matrix 14a including sensor array 164a is summed at the ten outputs L0-L5 and D0-D3 to initiate readout the coding assembly 46 of the dial encoder 36 and the twenty-five bits of dial codes are read in inputs G0, G1 and G3 and stored in the RAM 93 temporary storage 76 as is the option code OC. The code conversion and the ambiguity and interdial interpolation operations are performed as described for the dial code decoder 58 and initializing occurs to store the initial coded meter readings in both the first and second metal data stores 60 and 61 of RAM 93. The pulse decoder 59 FR and SD registers in RAM are also initialized. Following the initialization of the microcomputer 170a registers, the pulse accumulating mode of operation is provided by inputting on inputs 42 and 43 from the pulse encoder 38. The second meter data store 61 is incremented in response to the measuring pulses 80 from the decoder 59 and pulse encoder 38 as noted hereinabove.

If a power outage fail condition occurs at any time, when the above power up reset operations are again performed and the microprocessor 170a awaits an interrogation and meter read command input on data line 192a from the communication terminal 64. The meter read command input 63 and meter data out output 62 of FIG. 2 are provided at the input-output data line 192a in cooperative operation with the clock signals on the line 190a to the microprocessor 170a in FIG. 4.

When read commands 0, 1 or 2 are received, the encoder 36, array 164a and network 67 are scanned and read out to store the dial and option codes, decode them and to reload the first meter data store 60. If read command 2 is received, the first coded meter readings stored in the store 60 are read out directly to output them at data line 192a in the message word format discussed using the twenty-eight bit positions b6 to b33 of the message word.

In the aforementioned read commands 0 and 1, the first and dial totalized coded meter readings in the first meter data store 60 are compared by the absolute subtraction routine with the second and pulse augmented coded meter readings in the second meter data store 61 and, if no compare error, the coded meter reading in the second data store 61 is included in the message word output as noted above. If there is a compare error, the first meter data store 60 is output in the message word. If a read command 3 is received, the second meter data store 61 is output directly. In the above meter reading readout modes, the flags F0, F1, and F2 in the message word output indicate an error in the code conversion when the flag F1 is a binary one. The flag F0 is binary one if the power out flag bit has been set in response to a reset command or condition, and the flag F2 is binary one if there is a reading compare error. The power out flag is reset to clear the message flag F0 only upon the read command 1 being received in a meter read command.

Accordingly, an improved dual mode meter reading apparatus is provided in accordance with the present invention for producing high accuracy and high reliability at meters requiring remote readout and interrogation.

It will be apparent to those skilled in the art that other modifications and alternatives may be provided in the dual mode meter reading apparatus of this invention within the spirit and scope of the invention.

What we claim is:

1. A dual mode meter reading apparatus, comprising:
   first meter encoder means for producing first meter reading values representing totals of a first predetermined value of a progressively increasing quantity to be measured;
   second meter encoder means for producing repetitive indications of a second predetermined value of said quantity to be measured, said indications being produced at a rate proportional to the rate of increase in said quantity to be measured;
   first data storage means selectively responsive to said first encoder means for storing said first meter reading values occurring at predetermined times; and
   second data storage means receiving said first meter reading values occurring at a predetermined initial time and further being responsive to said second encoder means for incrementing said meter reading value occurring at said initial time by amounts proportional to said repetitive indications.

2. The dual mode meter reading apparatus as claimed in claim 1, including a comparator means for receiving a meter totalized meter reading value of said first data storage means and a pulse augmented meter reading value of said second data storage means and producing an output responsive to the comparison of said two meter reading values applied thereto.

3. The dual mode meter reading apparatus as claimed in claim 2, including a message output means for transmitting the meter reading value of said second data storage means when said comparator means indicates no error condition and for transmitting the meter reading value of said first data storage means when said comparator means indicates an error condition.

4. A dual mode meter reading apparatus for integrating meters having a measuring element rotatable at a rate proportional to the consumption of a quantity to be measured, said apparatus comprising:
   dial encoder means (36) including a plural order dial register assembly (20) for totalizing the rotation of said measuring element (14) and coding means (46) producing plural binary dial code logic words (DC5-DC1) each being responsive to a separate dial indicator (35-31) of said dial register assembly;
   first meter data storage means (60) for storing binary coded representations of said dial codes at plural digit positions (D5-D1) corresponding to the plural dial positions of said dial register assembly;
   pulse encoder means (38) producing meter pulses (68, 69) at a rate responsive to the rate of rotation of said measuring element so that each of the meter pulses is proportional to a predetermined quantum of the quantity to be measured;
   second meter data storage means (61) for storing binary coded representations of the accumulation of said meter pulses at plural digit positions (MDR-3DR) corresponding to the same number of digit positions as included in said first meter data storage means; and
   output means for selectively outputting the binary coded representations of said first and said second meter data storage means in a common message data word format.

5. The dual mode meter reading apparatus as claimed in claim 4 wherein said dial register assembly includes a predetermined number of decade related decimal dial positions and wherein said apparatus further includes pulse decoder means (59) for producing measuring pulses (80) responsive to said meter pulses (68, 69) with the count of said measuring pulses being accumulated by said second data storage means and further wherein each of said measuring pulses represents a predetermined decimal fraction (0.01) of the smallest decimal number indications (1 KWH) at the lowest order dial position (21) of said dial register assembly.

6. The dual mode meter reading apparatus as claimed in claim 5 wherein said coding means of said dial encoder means includes programmable means for producing an option code logic word (PSD-79) representing a predetermined meter pulse constant value for scaling the meter pulses (68 and 69) at said pulse decoder means with respect to the rotations of the measuring element of said meter.

* * * * *